(12) United States Patent
Yoneda et al.

(10) Patent No.: US 8,058,172 B2
(45) Date of Patent: Nov. 15, 2011

(54) POLISHING PROCESS OF A SEMICONDUCTOR SUBSTRATE

(75) Inventors: Yasuhiro Yoneda, Wakayama (JP); Mami Shirota, Wakayama (JP)

(73) Assignee: Kao Corporation, Tokyo (JP)

( * ) Notice: Subject to any disclaimer, the term of this patent is extended or adjusted under 35 U.S.C. 154(b) by 277 days.

(21) Appl. No.: 12/406,440

(22) Filed: Mar. 18, 2009

(65) Prior Publication Data
US 2009/0181541 A1    Jul. 16, 2009

Related U.S. Application Data

(62) Division of application No. 11/262,852, filed on Nov. 1, 2005, now abandoned.

(30) Foreign Application Priority Data

Nov. 30, 2004    (JP) ................. 2004-347220

(51) Int. Cl.
H01L 21/302    (2006.01)
H01L 21/461    (2006.01)

(52) U.S. Cl. ......... 438/690; 438/691; 438/692; 438/693

(58) Field of Classification Search .......... None
See application file for complete search history.

(56) References Cited

U.S. PATENT DOCUMENTS

| | | | |
|---|---|---|---|
| 6,171,352 B1 | 1/2001 | Lee et al. | |
| 6,565,422 B1 * | 5/2003 | Homma et al. | 451/67 |
| 6,783,434 B1 | 8/2004 | Akahori et al. | |
| 6,821,897 B2 * | 11/2004 | Schroeder et al. | 438/692 |
| 7,071,105 B2 | 7/2006 | Carter et al. | |
| 2004/0152309 A1 | 8/2004 | Carter et al. | |
| 2005/0076579 A1 | 4/2005 | Siddiqui et al. | |
| 2005/0194563 A1 | 9/2005 | Siddiqui et al. | |
| 2007/0084828 A1 | 4/2007 | Yoneda et al. | |

FOREIGN PATENT DOCUMENTS

JP    2004-335722 A    11/2004

* cited by examiner

*Primary Examiner* — Duy Deo
(74) *Attorney, Agent, or Firm* — Birch, Stewart, Kolasch & Birch, LLP

(57) ABSTRACT

A polishing composition containing at least one or more aminocarboxylic acids selected from the group consisting of serine, cysteine and dihydroxyethylglycine, ceria particles and an aqueous medium; a polishing process of a semiconductor substrate, including the step of polishing a semiconductor substrate with a polishing composition for a semiconductor substrate, containing at least one or more aminocarboxylic acids selected from the group consisting of serine, cysteine and dihydroxyethylglycine, ceria particles and an aqueous medium; a method for manufacturing a semiconductor device including the step of polishing a semiconductor substrate having a film formed on its surface, the film containing a silicon atom and having a shape with dents and projections, with a polishing pad pressed against a semiconductor substrate at a polishing load of from 5 to 100 kPa in the presence of a polishing composition for a semiconductor substrate, containing at least one or more aminocarboxylic acids selected from the group consisting of serine, cysteine and dihydroxyethylglycine, ceria particles and an aqueous medium.

14 Claims, 2 Drawing Sheets

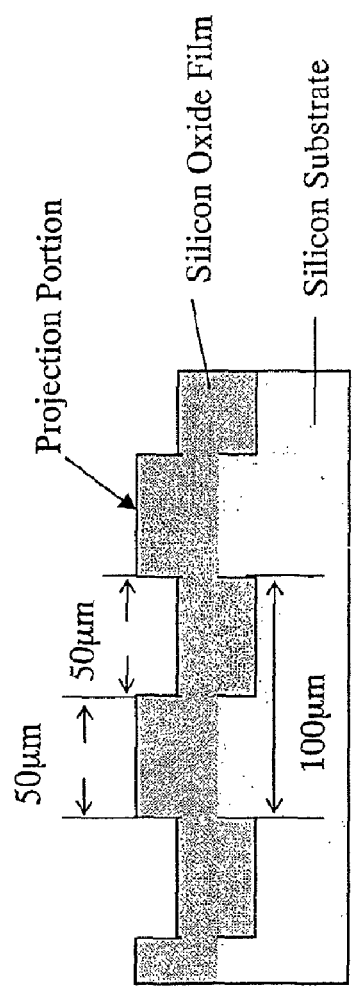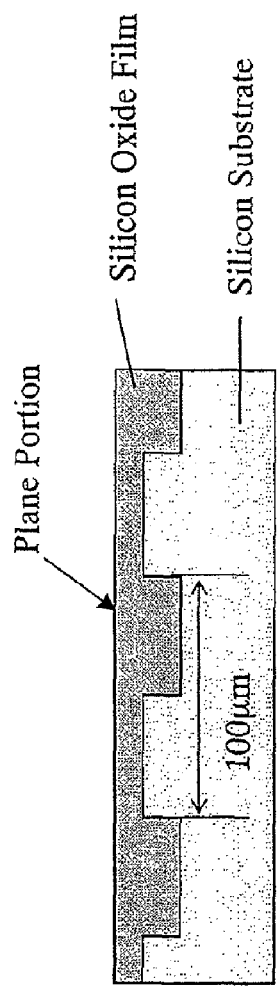

POLISHING PROCESS OF A SEMICONDUCTOR SUBSTRATE

This application is a Divisional of application Ser. No. 11/262,852, filed on Nov. 1, 2005 now abandoned, which claims priority under 35 U.S.C. §119(a) of Patent Application No. 2004-347220 filed in Japan on Nov. 30, 2004, the entire contents of which are hereby incorporated by reference.

FIELD OF THE INVENTION

The present invention relates to a polishing composition for a semiconductor substrate, a method for manufacturing a semiconductor device with the polishing composition for a semiconductor substrate, and a polishing process of a substrate.

BACKGROUND OF THE INVENTION

In the field of semiconductors in recent years, higher integration and speeding up have become advanced, and the production of thinner wiring is required especially in high integration. As a result, in the manufacturing process for a semiconductor substrate, since the focal depth becomes shallower during the exposure of a photoresist, even more improvement in surface planarization is desired.

In the manufacturing process for a semiconductor substrate, for example, in the step of forming wiring or the step of shallow trench isolation, there are numerous fine projections and dents having various widths due to formation of channels for wiring or embedding on the substrate. Therefore, planarization of the projections and dents is desired.

When the dents and projections on the surface of this substrate are polished, there are some disadvantages that the projection portions are rapidly polished with a polishing liquid containing only an abrasive, and the dent portions are also polished at the same time, so that it is time-consuming, and it is also necessary to polish a considerable amount of a member of a surface to be polished, to achieve substantial planarization of both the dent and projection portions.

Therefore, a technique for obtaining a plane semiconductor substrate by using a polishing composition capable of selectively polishing projection portions is known from JP 2001-7059 A.

However, the action of the polishing composition is very sensitive to the concentration of an additive and planarization properties are lowered (lowering of the polishing rate of projection portions or generation of dishing) even with a slight change in the polishing conditions such as states of a polishing pad. Therefore, it has been difficult to control the manufacturing process.

SUMMARY OF THE INVENTION

The present invention relates to:
[1] a polishing composition for a semiconductor substrate containing at least one or more aminocarboxylic acids selected from the group consisting of serine, cysteine and dihydroxyethylglycine, ceria particles, and an aqueous medium;
[2] a polishing process of a semiconductor substrate, including the step of polishing a semiconductor substrate with a polishing composition for a semiconductor substrate containing at least one or more aminocarboxylic acids selected from the group consisting of serine, cysteine and dihydroxyethylglycine, ceria particles, and an aqueous medium; and
[3] a method for manufacturing a semiconductor device including the step of polishing a semiconductor substrate having a film formed on its surface, the film containing a silicon atom and having a shape with dents and projections, with a polishing pad pressed against the semiconductor substrate at a polishing load of from 5 to 100 kPa in the presence of a polishing composition for a semiconductor substrate containing at least one or more aminocarboxylic acids selected from the group consisting of serine, cysteine and dihydroxyethylglycine, ceria particles, and an aqueous medium.

BRIEF DESCRIPTION OF THE DRAWINGS

FIG. 1 is a schematic explanatory view of a pattern wafer having D50 pattern (Line & Space patterns having a width of the projection portion of 50 μm and a width of the dent portion of 50 μm) used in the determination of the polishing rate of the projection portion in Examples.

FIG. 2 is a schematic explanatory view of a substrate to be polished used in the determination of the polishing rate of the plane portion in Examples, wherein the step height of the projections and dents (hereinafter simply referred to as "step height") of the substrate is disappeared and planarization is completed.

DETAILED DESCRIPTION OF THE INVENTION

Figure 3:
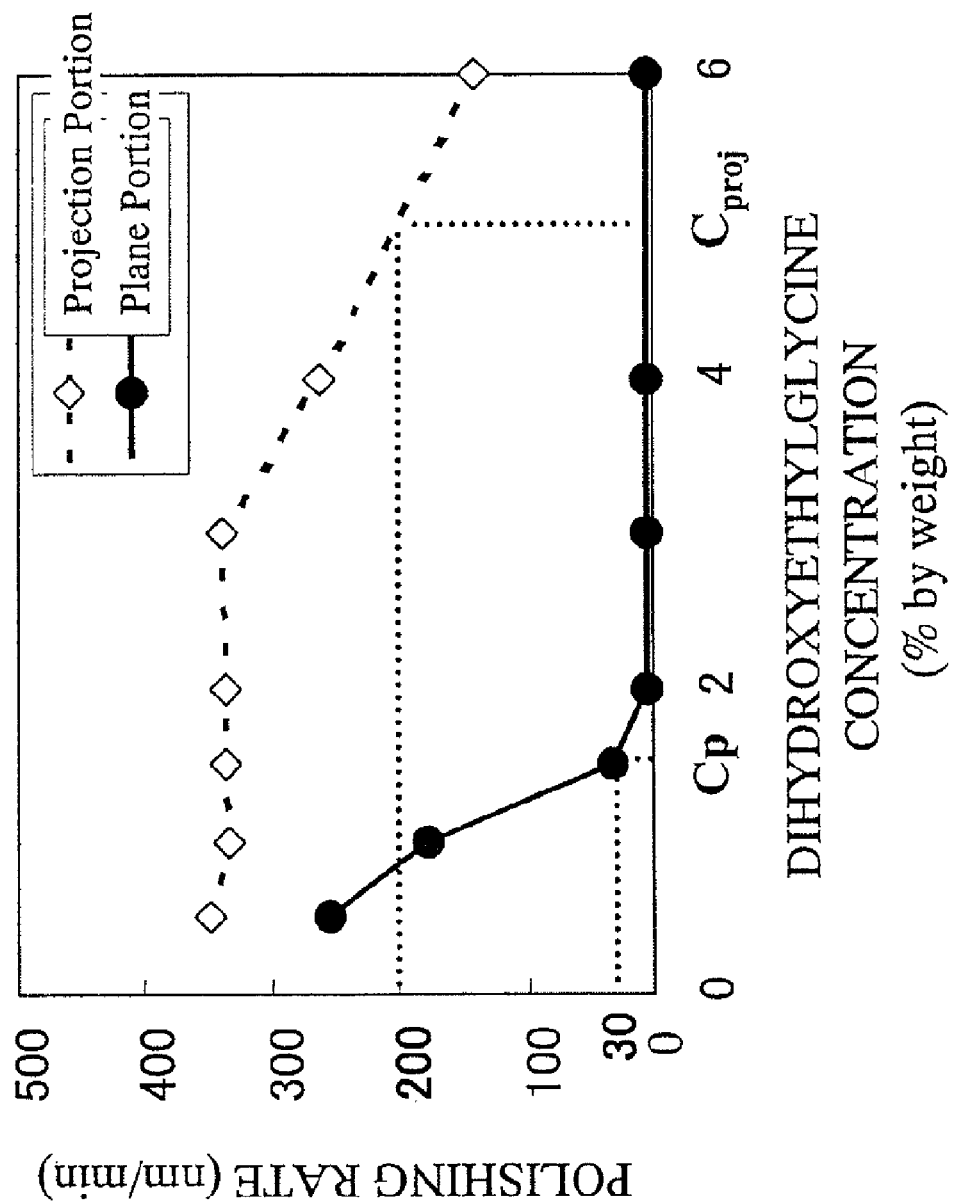
FIG. 3 is a graph schematically explaining the relation between the dihydroxyethylglycine concentration in the polishing composition and the polishing rates of the projection portion and the plane portion.

The present invention relates to a polishing composition for a semiconductor substrate having improved dependency on the concentration of an additive and being less likely to be affected by density or size of a dent-and-projection pattern of the surface to be polished, i.e., capable of rapidly accomplishing a high level of planarization with lower pattern dependency with a smaller polished amount; a method for manufacturing a semiconductor device with the polishing composition for a semiconductor substrate; and a polishing process of a substrate with the polishing composition for a semiconductor substrate.

Especially, the present invention relates to a polishing composition for a semiconductor substrate capable of rapidly carrying out planarization of dent-and-projection portions made of the same member on a semiconductor substrate.

By using the polishing composition for a semiconductor substrate of the present invention, a high-quality semiconductor substrate excellent in surface planarization is obtained, and a semiconductor device is manufactured with high productivity.

These and other advantages of the present invention will be apparent from the following description.

The polishing composition for a semiconductor substrate of the present invention (hereinafter simply referred to as a polishing composition) contains at least one or more aminocarboxylic acids selected from the group consisting of serine, cysteine and dihydroxyethylglycine, ceria particles and an aqueous medium as described above. Since the present invention has the above constitution, the dependency on the concentration of the additive is improved and a high level of planarization can be rapidly accomplished with a small polished amount, without being likely affected by the density or size of a dent-and-projection pattern of the surface to be polished, i.e., with a lower pattern dependency.

[Polishing Rate Selectivity]

Although not wanting to be limited by theory, the reason why the polishing composition of the present invention shows the high planarization property as mentioned above are presumably due to the fact that a mechanism explained below takes place by the co-presence of ceria particles and a specified aminocarboxylic acid.

[Mechanism]

Specifically, when the polishing composition is fed to a semiconductor substrate, a specified aminocarboxylic acid is adsorbed to a surface of ceria particles and/or a surface of a film to be polished to form a coating film. The coating film formed on the surface inhibits the action of the ceria particles on the surface of the film to be polished, thereby lowering the polishing rate. On the other hand, when a high polishing load is applied to the surface, the adsorption coating film of a specified aminocarboxylic acid is broken, so that the ceria particles can act on the surface of the film to be polished, thereby exhibiting a high polishing rate. Therefore, when a film to be polished having dents and projections is polished, a high polishing load is locally applied to the projection portions, so that the adsorption coating film is broken, and whereby the polishing progresses. By contrast, since a low load is locally applied to the dent portions, the surface is protected by the adsorption coating film, and whereby the polishing does not progress. Therefore, the polishing is selectively performed only on the projection portions, thereby efficiently progressing the reduction in the step height.

Furthermore, when polishing is progressed to reduce the step height, local loads applied to the projection portions and the dent portions approximate the set load. Therefore, by setting the polishing load in advance so that polishing is less likely to progress on the plane portion, characteristic polishing properties (polishing rate selectivity for projection portion/plane portion) that the polishing is less likely to progress after the disappearance of the step height (after planarization) can be exhibited.

As a result, an excellent effect that a high level of planarization with lower pattern dependency can be accomplished with a smaller polished amount is exhibited. This effect is also remarkable in a case where the surface of a semiconductor substrate contains at least a silicon atom.

Furthermore, depending on the kind of aminocarboxylic acids, the above-mentioned polishing rate selectivity for projection portion/plane portion is not exhibited at all in some cases and is exhibited in a very narrow concentration range of the aminocarboxylic acid even if exhibited in other cases.

The specified aminocarboxylic acid used for the present invention has a wide concentration range for exhibiting this polishing rate selectivity and can stably exhibit the planarization property, thereby being less likely to be affected by change in the polishing condition such as, for example, states of a polishing pad. Therefore, polishing can be accomplished with easy process control.

1) Polishing Composition

[Aminocarboxylic Acid]

The aminocarboxylic acid used for the present invention is one or more members selected from the group consisting of seine, cysteine and dihydroxyethylglycine.

Especially, dihydroxyethylglycine is preferable, from the viewpoint of improvement in process control due to extension of the region in which the polishing rate selectivity for projection portions/plane portions is exhibited.

The content of the aminocarboxylic acid is preferably from 0.1 to 20% by weight, and more preferably from 0.5 to 10% by weight of the polishing composition from the viewpoint of the planarization property.

[Ceria Particles]

The ceria particles used for the present invention include those which are prepared by various preparation processes. The preparation processes include baking method, hydrothermal synthesis method, salt catalysis method, vapor phase method (PSV method) and the like. Among them, the baking method including the step of baking a cerium compound of a carbonate, a sulfate, an oxalate or the like to give cerium oxide (ceria) is preferable, from the viewpoint of polishing rate.

The ceria particles have a volume-average particle size of preferably 30 nm or more from the viewpoint of the polishing rate, and a volume-average particle size of preferably 1000 nm or less from the viewpoint of dispersion stability and prevention of separation by precipitation of ceria particles in an aqueous medium. The ceria particles have a volume-average particle size of preferably from 30 to 1000 nm, more preferably from 40 to 500 nm, even more preferably from 50 to 160 nm, and even more preferably from 50 to 140 nm. Here, the volume-average particle size can be obtained from, for example, a median size obtained from laser diffraction/scattering method.

In addition, the ceria particles have an average primary particle size (crystallite size) of preferably 5 nm or more from the viewpoint of polishing rate, and an average primary particle size of preferably 100 nm or less from the viewpoint of suppressing generation of scratches on the polished surface. The ceria particles have an average primary particle size of preferably from 5 to 100 nm, more preferably from 10 to 50 nm, and even more preferably from 20 to 40 nm. Here, a method for determining the average primary particle size of the ceria particles includes a method for determining the particle size from a specific surface area determined according to BET method, supposing that the shape of particles is spherical, or a X-ray diffraction method.

The content of the ceria particles is preferably 0.1% by weight or more of the polishing composition, from the viewpoint of polishing rate, and the content is preferably 20% by weight or less of the polishing composition, from the viewpoint of dispersion stability of the ceria particles in the aqueous medium and cost. The above content is preferably from 0.1 to 20% by weight, more preferably from 0.2 to 10% by weight, even more preferably from 0.3 to 5% by weight, and even more preferably from 0.5 to 3% by weight of the polishing composition.

[Weight Ratio of Aminocarboxylic Acid to Ceria Particles]

In the polishing composition of the present invention, the weight ratio of the aminocarboxylic acid to the ceria particles is preferably 1/20 or more from the viewpoint of planarization property, and the weight ratio is preferably 50/1 or less from the viewpoint of rate of planarization.

The above weight ratio of the aminocarboxylic acid to the ceria particles is preferably from 1/20 to 50/1, more preferably from 1/10 to 20/1, and even more preferably from 1/5 to 10/1.

[Aqueous Medium]

The balance of the polishing composition of the present invention is an aqueous medium which is water or a mixed medium of water and a water-miscible aqueous medium such as an alcohol. The aqueous medium can be used alone or in admixture of two or more kinds. The aqueous medium is preferably water such as an ion-exchanged water.

The content of the aqueous medium is preferably from 60 to 99.8% by weight, and more preferably from 70 to 98% by weight of the polishing composition, from the viewpoint of increasing the polishing rate and the viewpoint of preventing precipitation and separation of the ceria particles.

[Process for Preparing a Polishing Composition]

The polishing composition of the present invention can be prepared by combining the ceria particles and the aminocarboxylic acid with the aqueous medium mentioned above. Especially, a process including the steps of preparing in advance an aqueous dispersion containing ceria particles (ceria slurry), and mixing the resulting ceria slurry and an aqueous solution prepared by dissolving an aminocarboxylic acid while stirring is preferable, from the viewpoint of dispersion stability of the ceria particles when the components are combined. In addition, a process including the step of adjusting each of the ceria slurry and the aqueous aminocarboxylic acid solution to a given pH prior to mixing, and thereafter mixing the components, or even more a process including the step of separately feeding the ceria slurry and an aqueous solution prepared by dissolving an aminocarboxylic acid to a polishing platen, and mixing the components on the polishing platen, from the viewpoint of storage stability can be carried out.

[Preparation of Ceria Slurry]

The ceria slurry can be prepared by carrying out dispersion treatment. The dispersion treatment includes a method including the step of dispersing with a mixer such as a homomixer, a homogenizer, an ultrasonic disperser, or a wet ball-mill. In addition, it is preferable that a dispersant is used together upon the dispersion treatment from the viewpoint of dispersibility of the ceria particles. Here, it is preferable that the pH of the ceria slurry is adjusted to a range of from 3 to 10.

The dispersant includes surfactants such as anionic surfactants and nonionic surfactants; polymeric dispersants such as polyacrylic acids or salts thereof, acrylic acid copolymers and ethylene oxide-propylene oxide block copolymers (Pluronics); and the like. Among them, polyacrylic acids are preferable from the viewpoint of dispersion effect, and the molecular weight thereof is preferably from 1000 to 10000, and more preferably from 1000 to 6000. In addition, the amount of the dispersant is preferably from 0.001 to 10% by weight, and more preferably from 0.01 to 1% by weight of the ceria slurry, from the same viewpoint.

It is preferable that the ceria slurry obtained as described above is subsequently subjected to the removal of coarse grains. As the method for removing the coarse grains, the coarse grains can be removed by centrifugation method or filtration method after the dispersion treatment.

In addition, it is preferable that the pH of the aqueous solution prepared by dissolving an aminocarboxylic acid is adjusted to a range of from 3 to 10.

[Optional Component]

In addition, the polishing composition of the present invention may be mixed with an anti-corrosive agent such as benzalkonium chloride, benzethonium chloride, 1,2-benzisothiazolin-3-one, hydrogen peroxide, or a hypochlorite as an optional component (additive). In addition, the polishing composition of the present invention can be mixed with an oxidizing agent such as a peroxide or permanganic acid, chromic acid, nitric acid, peroxo acid, or a salt thereof. These optional components can be mixed with any of the ceria slurry or the aqueous aminocarboxylic acid solution.

The amount of the optional component is preferably from 0.001 to 10% by weight, and more preferably from 0.01 to 5% by weight of the polishing composition.

[pH of Polishing Composition]

The pH range of the polishing composition of the present invention obtained according to the above-mentioned process is preferably from 3 to 10, more preferably from 4 to 8, and even more preferably from 5 to 7 from the viewpoint of polishing rate.

The pH of the polishing composition can be adjusted with a pH adjusting agent. The pH adjusting agent includes basic substances such as an aqueous ammonia, potassium hydroxide, a water-soluble organic amine and quaternary ammonium hydroxide, acidic substances such as an inorganic acid such as nitric acid, hydrochloric acid, sulfuric acid and phosphoric acid, and organic acids such as acetic acid, oxalic acid, succinic acid, glycolic acid, malic acid, citric acid and benzoic acid.

[Semiconductor Substrate]

The polishing composition of the present invention is used for polishing a semiconductor substrate.

The material for the semiconductor substrate includes, for example, metals or metalloids such as silicon, aluminum, nickel, tungsten, copper, tantalum and titanium, and alloys which contain these metals as a main component; glassy substances such as glass, glassy carbon and amorphous carbons; ceramic materials such as alumina, silicon dioxide, silicon nitride, tantalum nitride and titanium nitride; resins such as polyimide resins; and the like. Among them, those substrates having a film formed on its surface, the film containing a silicon atom and having a shape with dents and projections are preferable from the viewpoint of exhibiting efficient planarization. The film containing a silicon atom includes silicon oxides such as TEOS, quartz, and glass; silicon oxide, silicon nitride or polysilicon, each doped with an element such as phosphor or boron, such as BPSG (Boro-Phospho-Silicate Glass), PSG (Phospho-Silicate Glass); and the like. Especially, when polishing of a semiconductor substrate having a film to be polished containing silicon dioxide as a main component is carried out with the polishing composition of the present invention, efficient planarization can be realized.

Among them, the polishing composition of the present invention is suitable for polishing a semiconductor substrate having a shape with a step height of from 50 to 2000 nm for the purpose of planarization of the semiconductor substrate. The step height can be obtained with a profile analyzer (for example, commercially available from KLA-Tencor Corporation under the trade name of HRP-100).

Especially, when the semiconductor substrate having the step height is made of the same members, an excellent effect that the polishing of the projection portions can be carried out rapidly with the polishing composition of the present invention to achieve planarization is exhibited.

(2) Polishing Process

The polishing process of the present invention is not particularly limited, as long as the polishing of a semiconductor substrate is carried out with the above polishing composition. The process includes, for example, the steps of feeding the polishing composition to a substrate to be polished at a rate of from 0.01 to 10 g/min, more preferably from 0.1 to 10 g/min per 1 $cm^2$ of the substrate, and polishing the substrate with a polishing pad pressed against the substrate at a polishing load of from 5 to 100 kPa. As the semiconductor substrate to be polished, those substrates having a film formed on its surface, the film containing a silicon atom and having a shape with dents and projections are preferable from the viewpoint of exhibiting efficient planarization.

Accordingly, the present invention also relates to a polishing process of a semiconductor substrate, including the step of polishing a semiconductor substrate with the polishing composition as defined above. In a preferred embodiment, the substrate has a film formed on its surface, the film containing a silicon atom and having a shape with dents and projections.

[Feeding Rate of the Polishing Composition]

The feeding rate of the polishing composition is preferably 0.01 g/min or more, and more preferably 0.1 g/min or more per 1 cm$^2$ of a semiconductor substrate to be polished from the viewpoint of maintaining a high polishing rate and planarization in a short time, and the feeding rate is preferably 10 g/min or less, and more preferably 5 g/min or less per 1 cm$^2$ of a semiconductor substrate to be polished from the viewpoint of cost and waste liquid treatment. The feeding rate is from 0.01 to 10 g/min, preferably from 0.1 to 5 g/min.

[Polishing Load]

The polishing load is preferably 5 kPa or more, and more preferably 10 kPa or more from the viewpoint of the polishing rate, and preferably 100 kPa or less, more preferably 70 kPa or less, and even more preferably 50 kPa or less from the viewpoint of planarization and suppression of scratches of the surface to be polished. The polishing load is preferably from 5 to 100 kPa, more preferably from 10 to 70 kPa, and even more preferably from 10 to 50 kPa.

The polishing machine for a semiconductor substrate with the polishing composition of the present invention is not particularly limited, and a polishing machine equipped with jigs for supporting an object to be polished represented by a semiconductor substrate, and a polishing pad may be used for example. Specific examples of the polishing process using the polishing machine include a polishing process including the steps of polishing a surface of an object to be polished by pressing the above-mentioned jigs for supporting the object to be polished against polishing platens to which a polishing pad, such as one made of an organic polymer-based foamed article, a non-foamed article, or a nonwoven article, is attached, or alternatively by setting the substrate to be polished with polishing platens to which the polishing pad is attached, feeding the polishing composition of the present invention to a surface of the substrate to be polished, and moving the polishing platens or the substrate to be polished, while applying a given pressure. As the method for feeding the polishing composition, a method including the step of separately feeding a ceria slurry and an aqueous solution prepared by dissolving an aminocarboxylic acid to the polishing pad with a pump and the like, and mixing the components on the polishing platen, or a method including the step of feeding a polishing composition prepared by sufficiently mixing the constituents of the polishing composition in advance to the polishing pad can be used.

Here, the polishing conditions other than the feeding rate of the polishing composition or the polishing load are not particularly limited.

(3) Method for Manufacturing a Semiconductor Device

[Method]

The method for manufacturing the semiconductor device of the present invention includes the step of polishing a semiconductor substrate with the polishing composition as defined above. Examples of the method include a method including the step of polishing a semiconductor substrate having a film formed on its surface, the film containing a silicon atom and having a shape with dents and projections, with a polishing pad pressed against the semiconductor substrate at a polishing load of from 5 to 100 kPa in the presence of the polishing composition as defined above.

Here, the polishing conditions such as the feeding rate of the polishing composition or the polishing pad may be the same ones as in the above-mentioned polishing process.

Specifically, the method for manufacturing a semiconductor device includes a method including the steps of forming a thin film containing a silicon atom on an upper part of a semiconductor substrate having a shape with dents and projections, and polishing the thin film, wherein the polishing step includes feeding a polishing composition containing ceria particles and an aminocarboxylic acid to the surface of a polishing pad, and subjecting the surface of the thin film having a shape with dents and projections to planarization by the CMP (chemical-mechanical polishing). The method as described above includes the steps of subjecting to shallow trench isolation, subjecting an interlayer dielectric to planarization, forming an embedded metal line, forming an embedded capacitor, and the like. Especially, the method is suitable for the step of subjecting to shallow trench isolation or the step of subjecting an interlayer dielectric to planarization, and preferably used for manufacturing memory ICs, logic ICs, system LSIs or the like.

EXAMPLES

The following examples further describe and demonstrate embodiments of the present invention. The examples are given solely for the purposes of illustration and are not to be construed as limitations of the present invention.

Example 1

The amount 95.5 parts by weight of ion-exchanged water was added to 2.0 parts by weight of dihydroxyethylglycine (commercially available from CHELEST CORPORATION, Chelest Ga.), and the components were mixed to dissolve. Further, 2.5 parts by weight of an aqueous dispersion of ceria (solid content: 40% by weight, average particle size of ceria particles: 125 nm, crystallite size of ceria particles: 28 nm) (ceria particles being 1.0 part by weight) was added thereto while stirring. The pH was adjusted to 6.0 with an aqueous ammonia (ammonia: 28% by weight), to give a polishing composition.

Using the polishing composition prepared as described above, a polishing test was carried out under the following conditions, to evaluate polishing rates of the projection portion and plane portion, respectively.

<Polishing Conditions>

Polishing testing machine: single-sided polishing machine (product number: MA-300, commercially available from Engis Corporation, platen diameter: 300 mm)

Polishing pad: rigid urethane pad (product number: IC-1000/Sub400, commercially available from Nitta Haas Incorporated)

Rotational speed of a platen: 90 r/min

Rotational speed of a head: 90 r/min (rotational direction being the same as that of the platen)

Polishing load: 39.2 kPa

Feeding rate of the polishing composition: 50 g/min (3.1 g/min per 1 cm$^2$ of a substrate)

Evaluation of the Polishing Rate

[Polishing Rate of the Projection Portion]

Polishing was carried out under the above-mentioned polishing conditions for 1 minute using a square cut having 40 mm on each side of a commercially available wafer for evaluating CMP properties (patterned wafer, trade name: SKW 7-2, commercially available from SKW Associates, Inc., the wafer having a structure in which a PE-TEOS film having a thickness of 2000 nm was formed on an 8-inch (200 mm) patterned silicon wafer, the patterns having a step height of 800 nm).

The polishing rate of the projection portion was obtained by determining a film thickness of a silicon oxide film of the projection portion of D50 pattern (Line & Space patterns having a width of projection portion of 50 μm and a width of dent portion of 50 μm; see FIG. 1) on the patterned wafer before and after the polishing, and dividing the reduced amount of the film thickness by polishing time period. The film thickness was determined using a light interference-type film thickness gauge (LAMBDA ACE VM-1000, commercially available from DAINIPPON SCREEN MFG. CO., LTD.).

[Evaluation of the Polishing Rate of the Plane Portion]

The polishing rate of the plane portion is a polishing rate of a surface to be polished in which the step height disappears and planarization is completed (see FIG. 2). Here, in the evaluation, a square cut having 40 mm on each side of an 8-inch silicon substrate having a silicon oxide film (PE-TEOS film) formed in a thickness of 2000 nm by a plasma TEOS method was used as a substrate to be polished. Polishing was carried out under the above-mentioned polishing conditions for 2 minutes.

The polishing rate was obtained by determining the film thickness of the silicon oxide film at the central portion of the substrate to be polished before and after the polishing, and dividing the reduced amount of the film thickness by the polishing time period, to give a polishing rate of the plane portion. The film thickness was determined using a light interference-type film thickness gauge in the same manner as in the projection portion.

Polishing Results

It could be seen that the polishing rate of the polishing composition containing 2.0% by weight of dihydroxyethylglycine was 337 nm/min at the projection portion and 5 nm/min at the plane portion, thereby exhibiting a remarkably higher polishing rate at the projection portion, while suppressing the polishing rate at the plane portion. In other words, it can be seen that characteristic polishing rate selectivity for the projection portion/the plane portion is exhibited.

Similarly, the concentration of dihydroxyethylglycine was changed, and the polishing rate of the projection portion and the polishing rate of the plane portion were evaluated. The results are shown in Table 1.

TABLE 1

| | Concentration of Dihydroxyethylglycine (% by weight) | | | | | | |
|---|---|---|---|---|---|---|---|
| | 0.5 | 1 | 1.5 | 2 | 3 | 4 | 6 |
| Polishing Rate of Projection Portion (nm/min) | 348 | 334 | 337 | 337 | 339 | 262 | 140 |
| Polishing Rate of Plane Portion (nm/min) | 254 | 177 | 31 | 5 | 5 | 5 | 5 |

The relationship between the concentration of dihydroxyethylglycine and the polishing rates of the projection portion and the plane portion on the basis of the results of Table 1 is shown in FIG. 3. The concentration of the additive, Cp (% by weight) corresponding to a polishing rate of the plane portion of 30 nm/min, and the concentration of the additive, $C_{proj}$ (% by weight) corresponding to a polishing rate of the projection portion of 200 nm/min were obtained from FIG. 3. As a result, Cp was 1.6% by weight, and $C_{proj}$ was 5.0% by weight.

Within this range of the concentration of from Cp to $C_{proj}$, it is expected that a characteristic polishing rate selectivity for projection portion/plane portion can be exhibited, thereby accomplish a high level of planarization rapidly with lower pattern dependency. Therefore, it can be said that those additives which have a wide range of concentrations of Cp to $C_{proj}$ are excellent additives which give low concentration dependency and allow an easy process control.

However, the value of $C_{proj}$–Cp is affected by the purity of the additive, and the lower the purity of the additive, the more likely the values of $C_{proj}$ and Cp are shifted towards a high concentration side, and whereby the absolute value of $C_{proj}$–Cp becomes higher. Therefore, the value is insufficient as an index for accurately evaluating the properties of the compound. In view of the above, $(C_{proj}–Cp)/Cp$ was used as an index which is applicable independent from the purity. This value can cancel away the influence of the purity of the additive. The higher the value of $(C_{proj}–Cp)/Cp$, the less likely to be affected by change in polishing conditions, whereby process control can be facilitated.

In the case of dihydroxyethylglycine, the value of $(C_{proj}–Cp)/Cp$ is 2.1.

Examples 2 and 3, Comparative Examples 1 to 4

The same procedures as in Example 1 were carried out except that an additive shown in Table 2 was used in place of dihydroxyethylglycine of Example 1 to obtain Cp and $C_{proj}$, and calculate the value of $(C_{proj}–Cp)/Cp$. The results are shown in Table 2.

TABLE 2

| | Additive | Cp (% by weight) | $C_{proj}$ (% by weight) | $(C_{proj}–Cp)/Cp$ |
|---|---|---|---|---|
| Ex. 1 | Dihydroxyethylglycine | 1.6 | 5.0 | 2.1 |
| Ex. 2 | Cysteine | 2.0 | 5.0 | 1.5 |
| Ex. 3 | Serine | 3.0 | 9.0 | 2.0 |
| Comp. Ex. 1 | Aspartic acid | 0.65 | 1.0 | 0.54 |
| Comp. Ex. 2 | Glutamic acid | 0.9 | 1.2 | 0.33 |
| Comp. Ex. 3 | Arginine | 0.5 | 0.2 | —[1] |
| Comp. Ex. 4 | Ethylenediaminetetraacetic acid | 0.2 | 0.3 | 0.50 |

[1] The results took a negative (minus) value.

It can be seen from the results of Table 2 that polishing having excellent pattern planarization property is performed, since all of the aminocarboxylic acids used in Examples 1 to 3 exhibit high values for $(C_{proj}–Cp)/Cp$. On the other hand, in Comparative Examples 1, 2 and 4, values for $(C_{proj}–Cp)/Cp$ are low, and when arginine of Comparative Example 3 is used, the polishing rate of the projection portions is lowered at a lower concentration than that of the plane portion at which the polishing rate is suppressed, so that a region in which characteristic polishing rate selectivity for projection portion/plane portion is exhibited does not exist.

Therefore, it can be seen that polishing with poorer pattern planarization property is performed in all of Comparative Examples 1 to 4.

The polishing composition for a semiconductor substrate of the present invention is used, for example, for the steps of subjecting to shallow trench isolation, subjecting an interlayer dielectric to planarization, forming an embedded metal line, forming an embedded capacitor, and the like. Especially, the method is suitable for the step of shallow trench isolation or the step of subjecting an interlayer dielectric to planarization, and preferably used for manufacturing memory ICs, logic ICs, system LSIs or the like.

The present invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A polishing process of a semiconductor substrate, comprising:
   polishing a silicone oxide film on the semiconductor substrate with a polishing composition, comprising dihydroxyethylglycine, ceria particles and an aqueous medium,
   wherein the silicon oxide film on the semiconductor substrate contains a projection portion and a plane portion, and the polishing composition provides a different polishing rate selectivity to the projection portion and the plane portion of the silicon oxide film,
   wherein the dihydroxyethylglycine is present in the polishing composition in an amount of from 1 to 4% by weight, and
   wherein a difference of the polishing rate selectivity between the projection portion and the plane portion of the silicon oxide film is within a range of 157 nm/min to 334 nm/min.

2. The polishing process according to claim 1, wherein the step of polishing comprises;
   feeding the polishing composition to the substrate to be polished at a rate of from 0.01 to 10 g/min per 1 cm$^2$ of the substrate; and
   polishing the substrate with a polishing pad pressed against the substrate at a polishing load of from 5 to 100 kPa.

3. The polishing process according to claim 1, wherein the weight ratio of the dihydroxyethylglycine to the ceria particles (dihydroxyethylglycine/ceria particles) in the polishing composition is from 0.5/1 to 6/1.

4. The polishing process according to claim 1, wherein the ceria particles are present in the polishing composition in an amount of from 0.1 to 20% by weight.

5. The polishing process according to claim 1, wherein the ceria particles have a volume-average particle size of from 30 to 1000 nm.

6. The polishing process according to claim 1, wherein the polishing composition further comprises polyacrylic acid.

7. The polishing process according to claim 1, wherein the polyacrylic acid is present in the polishing composition in an amount of from 0.01 to 1% by weight.

8. The polishing process according to claim 1, wherein a pH of the polishing composition is from 3 to 10.

9. A polishing process of a semiconductor substrate, comprising:
   polishing a silicone oxide film on the semiconductor substrate with a polishing composition, comprising dihydroxyethylglycine, ceria particles, polyacrylic acid and an aqueous medium,
   wherein the silicon oxide film on the semiconductor substrate contains a projection portion and a plane portion, and the polishing composition provides a different polishing rate selectivity to the projection portion and the plane portion of the silicon oxide film,
   wherein the weight ratio of dihydroxyethylglycine acid to the ceria particles (dihydroxyethylglycine/ceria particles) in the polishing composition is from 0.5/1 to 6/1,
   wherein the dihydroxyethylglycine is present in the polishing composition in an amount of from 1 to 4% by weight, and
   wherein a difference of the polishing rate selectivity between the projection portion and the plane portion of the silicon oxide film is within a range of 157 nm/min to 334 nm/min.

10. The polishing process according to claim 9, wherein the step of polishing comprises;
    feeding the polishing composition to the substrate to be polished at a rate of from 0.01 to 10 g/min per 1 cm$^2$ of the substrate; and
    polishing the substrate with a polishing pad pressed against the substrate at a polishing load of from 5 to 100 kPa.

11. The polishing process according to claim 1, wherein the polishing rate selectivity of the projection portion of the silicon oxide film is within a range from 262 nm/min to 339 nm/min.

12. The polishing process according to claim 1, wherein the polishing rate selectivity of the plane portion of the silicon oxide film is within a range from 5 nm/min to 177 nm/min.

13. The polishing process according to claim 9, wherein the polishing rate selectivity of the projection portion of the silicon oxide film is within a range from 262 nm/min to 339 nm/min.

14. The polishing process according to claim 9, wherein the polishing rate selectivity of the plane portion of the silicon oxide film is within a range from 5 nm/min to 177 nm/min.

* * * * *